United States Patent [19]

Kaganowicz et al.

[11] Patent Number: 4,717,631
[45] Date of Patent: Jan. 5, 1988

[54] SILICON OXYNITRIDE PASSIVATED SEMICONDUCTOR BODY AND METHOD OF MAKING SAME

[75] Inventors: Grzegorz Kaganowicz, Belle Mead; Ronald E. Enstrom, Skillman, both of N.J.; John W. Robinson, Levittown, Pa.

[73] Assignee: RCA Corporation, Princeton, N.J.

[21] Appl. No.: 878,240

[22] Filed: Jun. 25, 1986

Related U.S. Application Data

[63] Continuation-in-part of Ser. No. 819,296, Jan. 26, 1986, abandoned.

[51] Int. Cl.$^4$ .................. H01L 21/316; H01L 21/318
[52] U.S. Cl. ...................... 148/33.3; 148/33; 313/619; 357/16; 357/20; 357/58; 357/61; 357/70; 427/39; 427/255.3; 428/620; 428/641; 428/642
[58] Field of Search .................. 313/619; 357/16, 20, 357/58, 61, 70; 427/39, 94, 95, 255.3; 428/620, 641, 642, 698, 148

[56] References Cited

U.S. PATENT DOCUMENTS

| | | | |
|---|---|---|---|
| 3,481,781 | 12/1969 | Kern . | |
| 3,765,935 | 8/1971 | Rand et al. | 117/201 |
| 3,886,000 | 5/1975 | Bratter et al. | 148/175 |
| 4,097,889 | 6/1978 | Kern et al. | 357/54 |
| 4,328,508 | 5/1982 | Kressel et al. | 357/16 |
| 4,512,284 | 4/1985 | Robinson et al. | 118/723 |
| 4,532,022 | 7/1985 | Takasaki et al. | 204/192 D |
| 4,543,707 | 10/1983 | Ito et al. | 29/578 |

FOREIGN PATENT DOCUMENTS

| | | |
|---|---|---|
| 0071203 | 2/1983 | European Pat. Off. . |
| 1211354 | 11/1970 | United Kingdom . |
| 1452884 | 10/1976 | United Kingdom . |

OTHER PUBLICATIONS

"Vapour-Phase Epitaxy of GaInAsP" by G. H. Olsen in *GaInAsP Alloy Semiconductors*, T. P. Pearsall, Edit. (1982) pp. 11–41, John Wiley and Sons.
Ackermann et al., IBM Technical Disclosure Bulletin, vol. 15, No. 12, p. 3888, May 1973.
Wilson, Solar Energy Materials, 10, pp. 9–24, (1984).

*Primary Examiner*—James C. Cannon
*Attorney, Agent, or Firm*—Allen L. Limberg; Fred Jacob; Harley R. Ball

[57] ABSTRACT

A semiconductor body with an improved passivating layer is disclosed. In one embodiment, the body is a device comprising a semiconductor material having regions of opposite conductivity types which form a semiconductor junction therebetween which extends to a surface of the device. The passivating layer, comprising silicon oxynitride having a refractive index between about 1.55 and 1.75 and a substantial hydrogen content, overlies the surface at the junction.

Also disclosed is a method for fabricating such a device wherein the vapor deposition of the passivating layer is carried out at low temperatures from an ambient having a ratio of silicon-containing to oxygen- and nitrogen-containing precursors of between about 1:1.67 and 1:5.

18 Claims, 3 Drawing Figures

SILICON OXYNITRIDE PASSIVATED SEMICONDUCTOR BODY AND METHOD OF MAKING SAME

RELATED APPLICATIONS

This application is a continuation-in-part of U.S. patent application Ser. No. 819,296, filed Jan. 26, 1986, and now abandoned.

This invention relates to a semiconductor body having a passivating layer and, more particularly, concerns a semiconductor body having a silicon oxynitride passivating layer and a method for its manufacture.

BACKGROUND OF THE INVENTION

In a photodetector, a semiconductor junction, e.g. a p-n or p-i-n junction, is formed at or near the interface of a light absorptive semiconductor body of a first conductivity type and a region of a second conductivity type overlying the body. When a reverse bias voltage is applied to the photodetector, a depletion region, void of mobile charge carriers, is created. Light incident on the photodetector is absorbed creating electron-hole pairs which are swept out of the depletion region thereby generating a detectable electric current. The junction periphery, i.e. the area where a semiconductor junction intersects the surface of the device, is typically characterized by edge breakdown and multiplication of surface leakage currents which substantially increase the dark current, i.e. the reverse bias leakage current which flows with no light incident on the device. This has the adverse effect of providing a less sensitive photodetector.

The incidence of edge breakdown and surface currents has been reduced by fabrication photodetectors such that the second region is a well-like area within the first region. This can be done, by example, by depositing a mask over the top surface of the first region and diffusing a dopant of the opposite conductivity type through an opening therein. This provides a junction which extends to the top surface of the first region under the mask. Preferably, the diffusion mask should also serve as a protective passivating layer since it covers the device surface at the semiconductor junction periphery.

Passivating layers of silicon oxides, e.g. $SiO_2$, provide a good moisture barrier, but not an ion barrier, for the portion of the semiconductor junction exposed at the surface of the device.

Passivating layers of silicon nitride provide an excellent barrier to ion migration, but are typically characterized by stress-induced cracking and loss of adhesion to the surface.

Silicon oxynitrides, which are used as diffusion barriers on semiconductor devices, typically have unpredictable and varying properties due to the various possible compositions of the oxynitride and, therefore, varying degrees of the above disadvantages.

A more effectively passivated semiconductor device and a method for its manufacture have been sought.

SUMMARY OF THE INVENTION

A semiconductor body having an improved passivating layer and a method for fabricating it are disclosed. The passivating layer, which is advantageously formed at low temperture, comprises a silicon oxynitride material having a refractive index between about 1.55 and 1.75, as measured at a wavelength of 632.8 nanometers (nm) and a substantial hydrogen content.

DETAILED DESCRIPTION OF THE PREFERRED EMBODIMENTS

Figure 1:
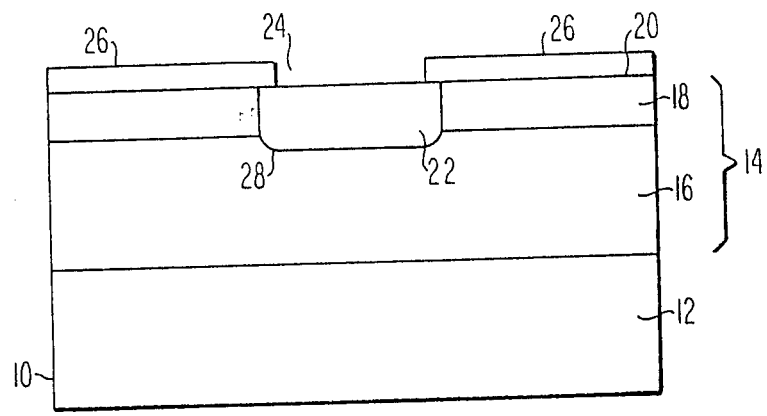
FIG. 1 is a cross section of a photodetector device which can be fabricated in accordance with this invention.

As illustrated in FIG. 1, a photodetector device comprises a semiconductor body 10 including a substrate 12 with a first region 14 of a first conductivity type thereover. The first region 14 comprises a light absorptive region 16 and a cap region 18 which serves to reduce surface recombination of photoelectrically generated photon-hole pairs. The first region 14 has an upper surface 20. A second region 22 of a second conductivity type, underlying an opening 24 in a passivating layer 26, typically extends into the absorptive region 16. A semiconductor junction, which may be a p-n or p-i-n junction, is formed at or near the interface 28 of the first and second regions 14 and 22, and extends to the upper surface 20 beneath the passivating layer 26.

The first and second regions 14 and 22 may be of either conductivity type so long as the relative conductivity relationship is maintained.

The photodetector of FIG. 1 is illustrated as a planar structure because of the distinct advantages the present invention provides for such a device. However, the photodetector may also be an art-recognized mesa structure.

The substrate 12 is typically composed of n-type InP. The surface upon which the first region 14 is formed is suitably oriented about 2.0 degrees from the (100) crystallographic plane.

The first region 14 is typically between about 6 and 9 micrometers ($\mu$m) thick and comprises the light absorptive region 16 and the cap region 18. The light absorptive region 16 is typically between about 5 and 6 $\mu$m thick and is comprised of an alloy which is absorptive of light at the particular wavelength to be detected. For the wavelength range between 1.2 and 1.7 $\mu$m, $In_{0.53}Ga_{0.47}As$ is a suitable material. The absorptive region 16, as deposited, is preferably undoped and has n-type conductivity modifiers in a concentration of less than about $5 \times 10^{15}/cm^3$. If the absorptive region 16 is sufficiently thick, it may serve as the substrate.

The cap region 18 is an optical window and is typically between about 2 and 3 $\mu$m thick. The cap region 18 may be of InP, preferably undoped, having n-type conductivity modifiers in a concentration of about $10^{16}/cm^3$. Alternatively, the light absorptive region 16 may serve as the entire first region 14.

The second region 22 is suitably between 2 and 3 $\mu$m thick and typically comprised of InP doped with a p-type conductivity modifier, e.g. zinc. Typically, the p-n junction is formed at the interface of the two regions 14 and 22. The second region 22 is generally from about 0.25 to 0.75 $\mu$m thicker than the cap region 18 so that the second region 22 extends about this distance into the light absorptive region 16. This, in turn, provides that the second region 22 also may include p-type InGaAs. The second region can be formed by diffusing a p-type dopant, e.g. zinc, through an opening in a masking layer into the cap region 18. Alternatively, the second region 22 can be formed by other known methods, such as ion implantation followed by an annealing step. The second region 22 should contain at least about $1 \times 10^{17}$ acceptors/cm$^3$. Typically, the substrate 12 and second region 22 are light-transmissive and preferably substantially transparent at the wavelength to be detected.

The electrical contacting means (not shown) to the second region 22 may suitably be a gold-zinc alloy if the second region 22 is p-type. The contacting means to the substrate 12 may suitably be of a gold-tin alloy if the substrate 12 is n-type.

It should be appreciated that the regions described may also be discrete layers grown onto the semiconductor substrate 12 by conventional techniques. Also, other combinations of Group III and V elements may be used in the regions depending upon the detector requirements. Well-known vapor or liquid phase epitaxial or molecular beam epitaxy growth techniques may be employed to form the photodetector. One such technique is described by G. H. Olsen in "Vapour-phase Epitaxy of GaInAsP", a chapter from *GaInAsP ALLOY SEMICONDUCTORS*, edited by T. P. Pearsall.

Although a layer of material may be applied to the surface 20 of the light absorptive region 14 specifically to serve as a diffusion mask for the formation of second conductivity region 22 and subsequently removed, it is preferred that the passivating layer 20 also serve as the diffusion mask. The passivating layer 26, therefore, should be both a good passivant for the semiconductor junction which extends to the surface 20 and a good barrier for the ions used to form the second region 22, typically zinc. It has been found that silcon oxynitrides formed at low temperature according to the subject process have a particular refractive index and a good combination of all of the characteristics necessary for passivating a semiconductor device junction. The subject passivating layers have been found to possess excellent impermeability to zinc diffusion, as well as more reliable reduction of edge breakdown and dark current, better adhesion and enhanced moisture insensitivity. Silicon oxynitrides having a refractive index between about 1.55 and 1.75, measured at a wavelength of 632.8 nm, and preferably about 1.60, particularly suitable for passivating layers in semiconductor devices such as described herein. The criticality of the refractive indices of the subject oxynitrides can be appreciated when it is considered that a layer of such material having a refractive index of below 1.55 is characterized by excessive permeability of ions and dopants therethrough, and a layer having a refractive index of above 1.75 is characterized by poor adhesion to the substrate. The fact that the subject passivating layers can be formed at ambient temperature, i.e. about 25° C., is of significant advantage when it is necessary to form a passivating layer over a temperature sensitive material such as indium phosphide.

The passivating layer 26 should have a thickness of at least about 90 nanometers (nm) at a refractive index of 1.55 and can be deposited up to a thickness of about several hundred nanometers, with a preferred thickness being about 300 nm. For applications requiring a thicker (>400 nm) passivating layer 26, the additional thickness can suitably be provided by depositing borophosphosilicate glass (BPSG) over the silicon oxynitride layer 26.

Although the silicon oxynitride passivating layer 26 overlies, and typically contacts, the upper surface 20, in certain situations it may be advantageous to interpose another layer between the upper surface 20 and the passivating layer 26. For example, in the case of devices comprising a phosphorus-containing material, e.g. indium phosphide, a phosphorus-containing passivant, e.g. BPSG, may be interposed between the upper surface 20 and the silicon oxynitride layer 26. Such an arrangement is advantageous as the BPSG tends to be compatible with the indium phosphide material and the silicon oxynitride provides an excellent moisture and ion barrier.

The passivating layer 26 can be deposited by known vapor deposition techniques such as plasma enhanced chemical vapor deposition (PECVD), which can be carried out at low temperatures, e.g. between about 25° C. and 200° C., preferably at ambient temperature. Low temperature techniques are essential in the passivation of indium-containing devices, such as photodectors, in that they assure the integrity of the substrate. Typical precursors are silane (SiH$_4$), ammonia (NH$_3$) and nitrous oxide (N$_2$O), providing the silicon, nitrogen, and oxygen, respectively. It has been found that the ratio of flow rates of SiH$_4$:NH$_3$+N$_2$O should be maintained between about 1:1.67 and 1:5 to produce silicon oxynitride films in the desired range of refractive indices. The use of ammonia as a source of nitrogen provides a hydrogen content in the passivating layer 26 of from about 8 to about 20 atomic percent. The presence of hydrogen in the passivating layer 26 lowers the refractive index thereof by about 10 percent. The layer 26 also comprises from about 9 to about 35 atomic percent of silicon, from about 9 to about 35 atomic percent of nitrogen, and from about 10 to about 50 atomic percent of oxygen. Preferably, the silicon oxynitride material contains, from about 10 to about 15 atomic percent of hydrogen, from about 25 to about 30 atomic percent of silicon, from about 25 to about 30 atomic percent of nitrogen and from about 20 to about 40 atomic percent of oxygen.

If a thickness of BPSG is desired either under or over the passivating layer 26, the BPSG may be deposited by known techniques. For example, U.S. Pat. No. 3,481,781 to Kern discloses the chemical vapor deposition of various silicate glasses at temperatures typically between about 300° and 450° C. It has been found that deposition temperatures for the BPSG of not substantially above 300° and, in any event, not above 360° C. are suitable for indium phosphide-containing devices.

The qualities of the device and the effectiveness of the passivating layer are further enhanced when the surface to receive the passivating layer is treated prior to deposition. A copending application entitled "Method of Making a Passivated Semiconductor Device" Ser. No. 871,316, filed June 6, 1986, discloses a process wherein the surface to be coated is treated, for example, in an aqueous ammonium fluoride-hydrogen fluoride solution and thereafter subjected to a plasma in an oxygen-free, nitrogen-containing ambient.

In order to deposit a passivating layer over a surface of a photodetector or similar device, the device is placed into a standard glow discharge apparatus, such as that disclosed by Robinson et al. in U.S. Pat. No. 4,512,284. The chamber is evacuated to between about $10^{-5}$ and $10^{-6}$ torr. The precursors are introduced into the chamber at the desired flow rates to a partial pressure suitably between about 10 to 50 millitorr, preferably between about 40 and 45 millitorr. A plasma is initiated by applying power to the system, e.g. 400 Watts at 13.56 MHz to aluminum electrodes, and maintaining this power until a desired thickness of the silicon oxynitride has been deposited.

Figure 2:
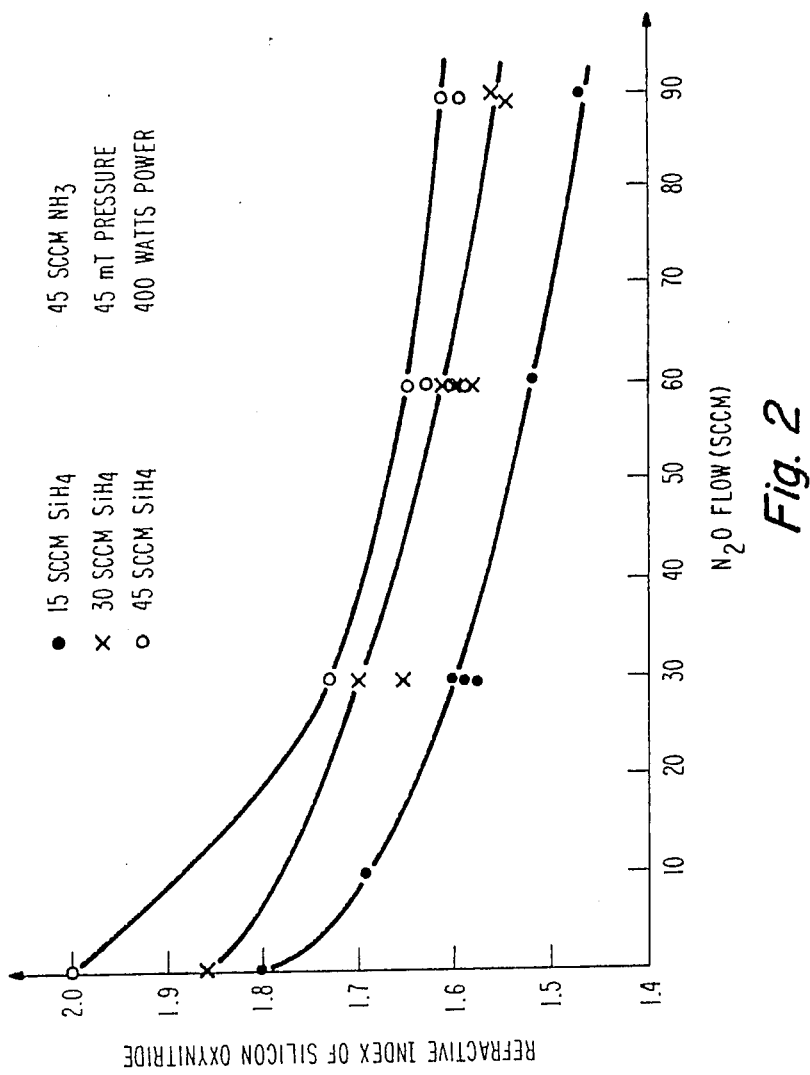
FIG. 2 is a graph of the refractive index of silicon oxynitride as a function of nitrous oxide precursor flow rate.

FIG. 2 illustrates the relationship of varying deposition parameters to the refractive index of the resultant silicon oxynitride layers. In FIG. 2, the graph shows the refractive index as a function of $N_2O$ flow during PECVD for three different flow rates of silane. The three curves in the graph of FIG. 2 show the various combinations of precursor flow rates available to produce oxynitride layers within the desired range of refractive indices.

Figure 3:
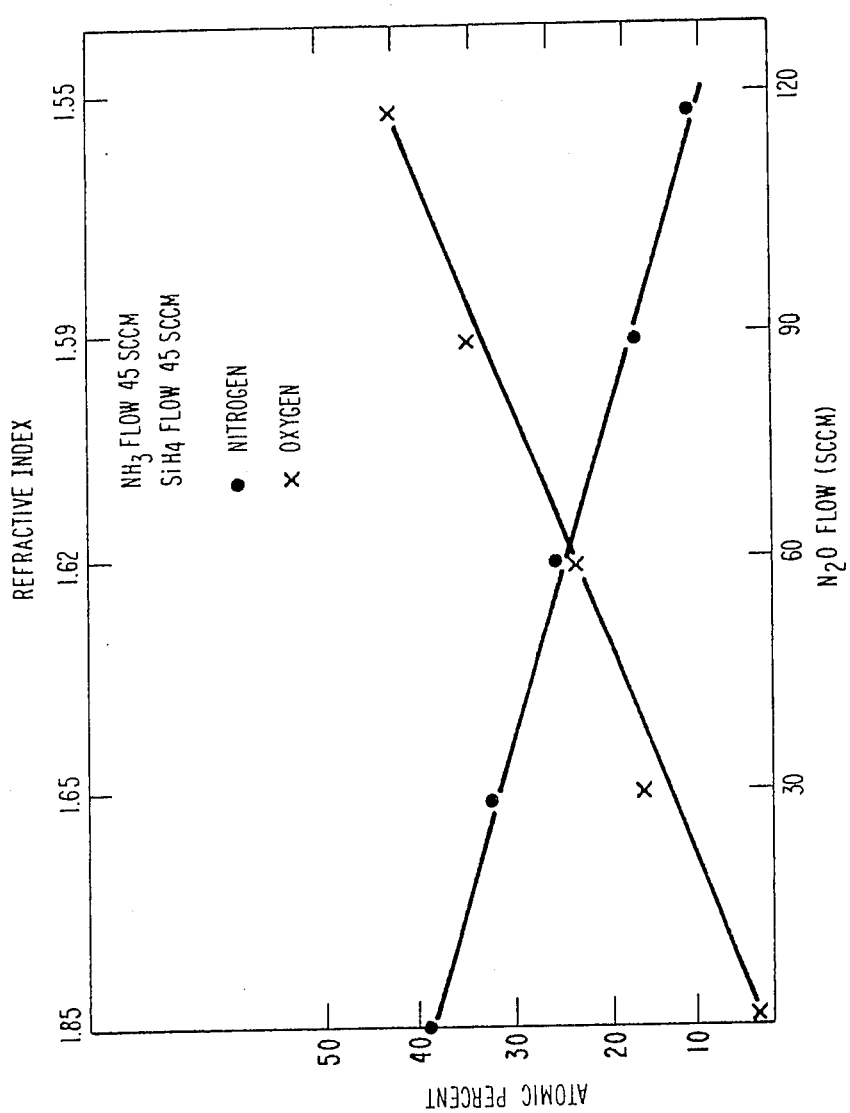
FIG. 3 is a graph of atomic percent of oxygen and nitrogen as a function of nitrous oxide percursor flow rate.

To further illustrate the effect of changing deposition parameters on the resultant silicon oxynitride layers, FIG. 3 is a graph of the atomic percents of oxygen and nitrogen within the layers as a function of $N_2O$ flow during deposition. The results, which are also plotted as a function of index of refraction, are for a constant $NH_3$ flow of 45 sccm and a constant $SiH_4$ flow of 45 sccm. The percentages of oxygen and nitrogen were determined by Auger Electron Spectroscopy (AES) and corrected for the hydrogen content in each sample since the AES technique does not detect hydrogen. The hydrogen content was separately determined by Secondary Ion Mass Spectroscopy (SIMS) to arrive at the corrected values.

The subject method of forming a passivating layer is particularly advantageous with regard to passivating photodetectors in that the passivated devices have been found to be moisture insensitive and have substantially reduced surface leakage and dark current as evidenced by their typically low dark current and high breakdown voltages.

While the method of this invention has been described by reference to an InGaAs/InP ternary alloy planar-type photodetector, it should be noted that other alloy systems or semiconductors and other structures, e.g. mesa devices and other semiconductor devices in general could also benefit from the passivation material disclosed herein.

The following examples further illustrate this invention, it being understood that the invention is in no way intended to be limited to the details described therein. In the Examples, all parts and percentages are on a weight basis and all temperatures are in degrees Celsius, unless otherwise stated.

EXAMPLE I

As InGaAs/InP planar body with an n-type InP cap was placed into a glow discharge apparatus. The system was evacuated to about $10^{-6}$ Torr. $NH_3$ and $SiH_4$ were introduced into the system at individual flow rates of about 45 sccm. $N_2O$ was introduced at a flow rate of about 15 sccm. A plasma was initiated by applying 400 Watts of power at 13.56 MHz. A 300 nm thick silicon oxynitride film was deposited over the cap region at ambient temperature. The resultant silicon oxynitride had a refractive index (as measured at a wavelength of 632.8 nm) of about 1.82. The passivating layer contained bubbles and eventually peeled in many areas during subsequent etching and diffusion procedures.

EXAMPLE II

The identical procedure was followed for a second InGaAs/InP body except that the flow rates were 45 scam of $NH_3$, 45 sccm $SiH_4$ and 60 sccm of $N_2O$. The resultant silicon oxynitride layer had a refractive index of about 1.60. SIMS analysis showed that it contained about 12 percent of hydrogen. Planar photodetectors subsequently fabricated from the second body by known etching and diffusion techniques had low dark currents and excellent adhesion of the passivating layer. Devices fabricated in this manner have shown excellent stability of electrical characteristics in excess of 3000 hours at 150° C. and 9 volts reverse bias in an accelerated test of the device reliability and lifetime.

EXAMPLE III

A layer of silicon nitride was formed on silicon wafers by equal flow rates of ammonia and silane under the following conditions: chemical vapor deposition at 850°; plasma enhanced chemical vapor deposition at 380° and 25°, respectively. SIMS analysis showed the hydrogen content of the three films to be: about 1 percent; about 7-8 percent and about 12-15 percent, respectively.

Utilizing the same conditions except for the addition of nitrous oxide in the proportion of Example II produced films having about 1 percent; from 5-6 percent and 9-12 percent of hydrogen, respectively.

Experience has shown that repeating the same experiment with substitution of nitrogen for ammonia would produce films having, at the average, 20 percent less hydrogen due to the elimination of ammonia as a source of hydrogen.

We claim:

1. In a semiconductor body having a passivating layer which overlies a surface of said body,
the improvement wherein said passivating layer comprises a silicon oxynitride material deposited by plasma enhanced chemical vapor deposition at a temperature of from about 25° to about 200° C., said layer having a refractive index of between about 1.55 and 1.75 and being comprised of from about 8 to about 20 atomic percent of hydrogen, from about 9 to about 35 atomic percent of silicon, from about 9 to about 35 atomic percent of nitrogen, and from about 10 to about 50 atomic percent of oxygen.

2. A semiconductor body in accordance with claim 1, wherein said body comprises first and second regions of opposite conductivity types with a semiconductor junction therebetween which extends to said surface.

3. A body in accordance with claim 1, wherein said passivating layer is in contact with said surface.

4. A body in accordance with claim 1, wherein the passivating layer has a refractive index of about 1.60.

5. A body in accordance with claim 1, wherein the silicon oxynitride material comprises from about 10 to about 15 atomic percent of hydrogen, from about 25 to about 30 atomic percent of silicon, from about 25 to about 30 atomic percent of nitrogen, and from about 20 to about 40 atomic percent of oxygen.

6. A body in accordance with claim 1, wherein the passivating layer further comprises a layer of borophosphosilicate glass overlying said passivating layer.

7. A body in accordance with claim 1, wherein a layer of borophosphosilicate glass is interposed between the surface and said passivating layer.

8. A body in accordance with claim 1, wherein said body is comprised of an alloy of indium.

9. A body in accordance with claim 2, wherein said body comprises: a substrate; said first region overlying said substrate; and said second region disposed within said first region such that said semiconductor junction extends to said surface and underlies said passivating layer, said passivating layer having an opening therethrough contiguous with said second region.

10. A body in accordance with claim 9, further comprising a light-absorptive region.

11. A body in accordance with claim 10, wherein the first region is said light absorptive region.

12. A body in accordance with claim 11, wherein said first region comprises an absorptive region and a cap region thereover.

13. A body in accordance with claim 12, wherein the subtrate is n-type InP, the absorptive region is an In-GaAs alloy, the cap region is n-type InP and the second region is p-type InP.

14. In a method of making a semiconductor device comprising:
forming on a suitable substrate a first region of a first conductivity type;
forming a second region of a second conductivity type adjacent said first region such that a semiconductor junction is formed therebetween, which junction extends to a surface of said device; and
depositing a passivating layer over said surface at said junction,
the improvement comprising depositing as said passivating layer silicon oxynitride having a refractive index of between about 1.55 and 1.75 and comprising from about 8 to about 20 atomic percent of hydrogen, from about 9 to about 35 atomic percent of silicon, from about 9 to about 35 atomic percent of nitrogen, and from about 10 to about 50 atomic percent of oxygen, said layer being deposited at a temperature of between about 25° C. and 200° C. by plasma enhanced chemical vapor deposition from an atmosphere comprising silicon-containing, nitrogen-containing and oxygen-containing precursors.

15. A method in accordance with claim 14, wherein the passivating layer is deposited on the first region before formation of said second region and wherein said second region is formed by diffusion, said method additionally including the step of forming an opening in said passivating layer to function as a mask for said diffusion.

16. A method in accordance with claim 14, wherein said precursors are silane, ammonia, and nitrous oxide, respectively.

17. A method in accordance with claim 16, wherein the ratio of silane to nitrous oxide plus ammonia is between about 1:1.67 and 1:5.

18. A method in accordance with claim 17, wherein the deposition is carried out at about 25° C.

* * * * *